(12) United States Patent
Tsutsui et al.

(10) Patent No.: US 7,414,364 B2
(45) Date of Patent: Aug. 19, 2008

(54) DISPLAY ELEMENT AND METHOD OF MANUFACTURING THE SAME

(75) Inventors: Tetsuo Tsutsui, Fukuoka (JP); Kazuhiro Sumioka, Fukuoka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 261 days.

(21) Appl. No.: 10/978,740

(22) Filed: Nov. 1, 2004

(65) Prior Publication Data

US 2005/0088089 A1 Apr. 28, 2005

Related U.S. Application Data

(62) Division of application No. 09/907,133, filed on Jul. 17, 2001, now Pat. No. 6,866,555.

(30) Foreign Application Priority Data

Jul. 31, 2000 (JP) ............................. 2000-230239

(51) Int. Cl.
*H01L 51/50* (2006.01)
*H05B 33/04* (2006.01)

(52) U.S. Cl. ................. 313/512; 313/503; 313/506; 313/509

(58) Field of Classification Search ................ 313/511, 313/512, 502–503, 504, 506
See application file for complete search history.

(56) References Cited

U.S. PATENT DOCUMENTS

| | | | | |
|---|---|---|---|---|
| 3,959,045 A | | 5/1976 | Antypas | 438/20 |
| 4,417,174 A | * | 11/1983 | Kamijo et al. | 313/502 |
| 4,975,338 A | * | 12/1990 | Kageyama et al. | 313/503 |
| 5,427,858 A | * | 6/1995 | Nakamura et al. | 313/512 |
| 5,482,896 A | * | 1/1996 | Tang | 438/28 |
| 5,504,389 A | * | 4/1996 | Dickey | 313/506 |
| 6,060,729 A | | 5/2000 | Suzuki et al. | 257/99 |
| 6,136,622 A | * | 10/2000 | Fukuzawa et al. | 313/506 |
| 6,280,559 B1 | | 8/2001 | Terada et al. | 156/295 |
| 6,287,882 B1 | | 9/2001 | Chang et al. | 438/29 |
| 6,551,440 B2 | | 4/2003 | Tanaka | |
| 2002/0125817 A1 | | 9/2002 | Yamazaki et al. | 313/498 |

FOREIGN PATENT DOCUMENTS

| | | |
|---|---|---|
| JP | 55-065483 | 5/1980 |
| JP | 10-149879 | 6/1998 |
| JP | 2000-10506 | 1/2000 |

OTHER PUBLICATIONS

Tang, C.W. et al, "Organic Electroluminescent Diodes," Appl. Phys. Lett., vol. 51, No. 12, pp. 913-915, Sep. 21, 1987.

\* cited by examiner

*Primary Examiner*—Mariceli Santiago
(74) *Attorney, Agent, or Firm*—Cook, Alex Ltd.

(57) ABSTRACT

There is provided a display element capable of efficiently emitting generated light externally and a method of manufacturing the display element, without damaging an organic electroluminescent layer. First, a transparent electrode protection material (11) is deposited on a first holding substrate (10); then organic electroluminescent light-emitting elements (12, 13, 14) are manufactured thereon; and then after sealing and holding with a sealing material (15) and a second holding substrate (16), the first holding substrate (10) and a transparent electrode protection material (11) are removed by etching or the like. According to the present invention, the removal of the first holding substrate (10) enables improvement of the emission rate generated in the electroluminescent layer (13), and improvement of brightness and contrast in the display element.

18 Claims, 3 Drawing Sheets

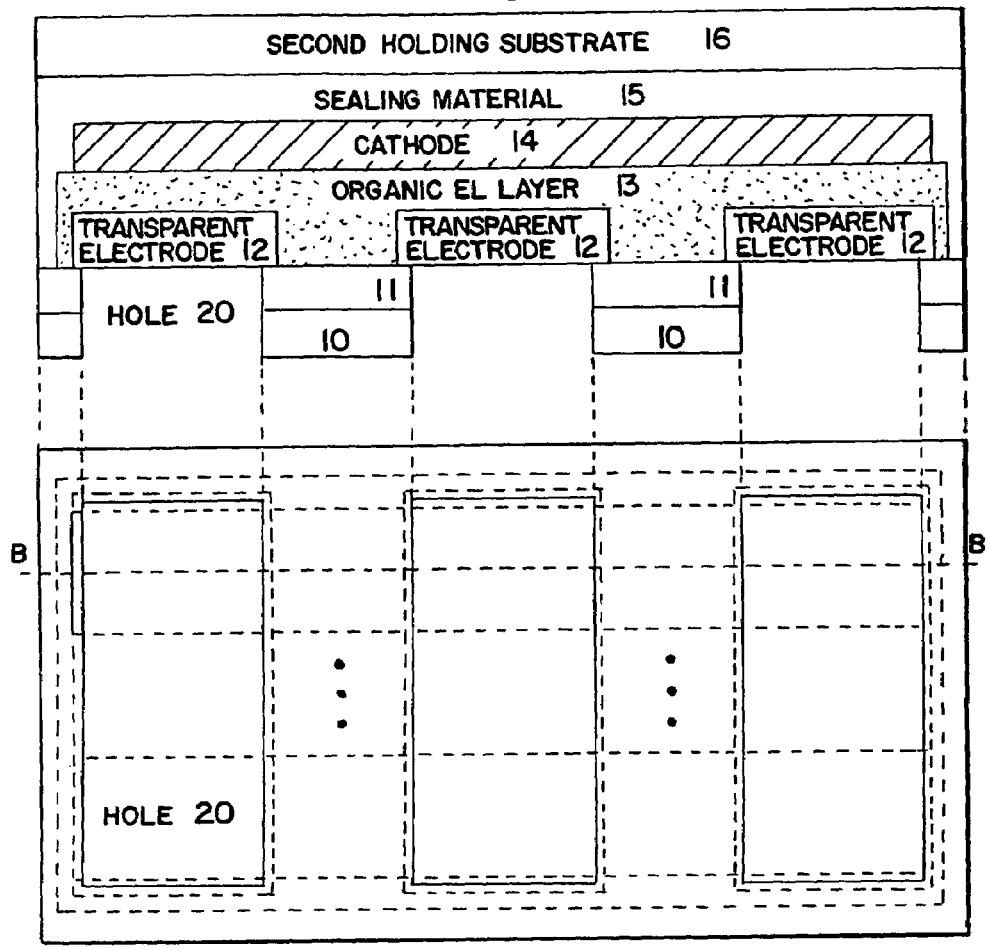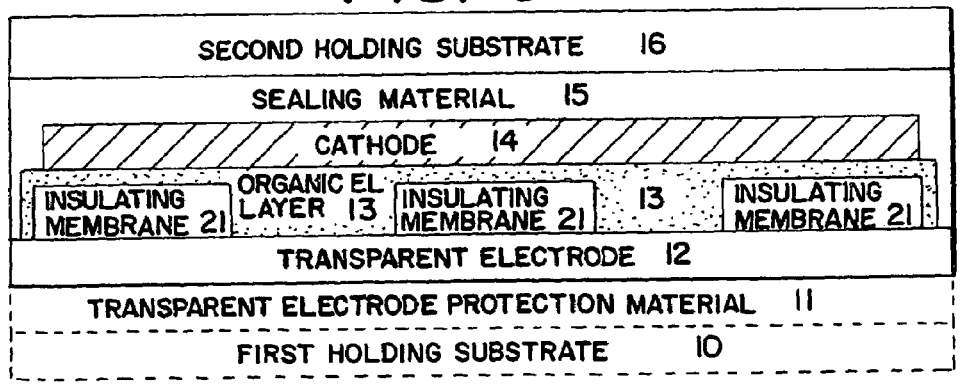

DISPLAY ELEMENT AND METHOD OF MANUFACTURING THE SAME

This application is a divisional of U.S. application Ser. No. 09/907,133, filed on Jul. 17, 2001 now U.S. Pat. No. 6,866,555.

BACKGROUND OF THE INVENTION

1. Field of the Invention

The present invention relates to a display element and a method of manufacturing a display element, and particularly, to a display element capable of efficiently emitting generated light externally and a method of manufacturing the display element.

2. Description of the Related Art

Conventionally, in the case of display elements which use, for example, an organic electroluminescent element or the like as a light emitting element, the organic electroluminescent element is typically formed over a glass substrate. FIGS. 2A to 2C are explanatory diagrams showing constructions and operations of a conventional display element. FIG. 2A is an explanatory diagram showing an example construction of a first conventional element. Note, however, that in the diagram, each layer is depicted in an exaggerated fashion and differs from actual relative proportions.

The EL (electroluminescent) elements referred to in this specification include triplet-based light emission elements and/or singlet-based light emission devices, for example.

The conventional sequence for forming the film coating is to sputter a transparent electrode 31 (e.g., ITO: indium oxide-tin oxide alloy) on a glass substrate 30, and then an organic electroluminescent layer 32 is formed by vapor deposition or by spin coating onto the substrate 31, and a cathode 33 is evaporated. After that, sealing material 34 is used to adhere a facing substrate 35 to prevent deterioration of the organic electroluminescent layer 32 and the cathode 33 due to the atmosphere.

FIG. 2B is an explanatory diagram showing an optical path in the first conventional example element. In the above-mentioned conventional structure the cathode material of the cathode 33 is a metal. Therefore, light emerges from the substrate 30 side (FIG. 2B, optical path A), but, due to differences in the refraction indices of each of the layers, the light cannot escape from the front surface of the element at a angle greater than the critical angle (FIG. 2B, optical paths B and C). Therefore, the emergence ratio of the light is $1/(2n^2)$; where n is the refraction index of the luminous layer 32 (approximately 1.6). Therefore, there was a problem that 80% of the light generated was guided inside the glass substrate 30 and escaped sideways.

In order to avoid this problem, a method has been proposed for forming the film coating on the glass substrate in the reverse sequence starting with the cathode. FIG. 2C is an explanatory diagram showing a structure of a second conventional example element. The sequence for forming the film coatings was, first, to vapor deposit a cathode 36 on the glass substrate 30. Then, after vapor depositing or spin coating an organic electroluminescent layer 37 for film coating, a transparent electrode 38 such as that of ITO was formed by sputtering. In this case it was necessary to sputter a transparent conducting film 38 such as that of ITO onto the electroluminescent film 37, but there was a problem that the organic electroluminescent layer 37 was altered due to damage suffered and increased temperature experienced during sputtering.

SUMMARY OF THE INVENTION

An object of the present invention is to solve the above-mentioned problems in the prior art, and provide a display element and a method of manufacturing a display element capable of effectively emitting generated light externally, without damaging the organic electroluminescent layer.

The present invention is characterized in that, after a light emitting element is manufactured in the same sequence as the first conventional example element (FIG. 2A) and sealed, a holding substrate for forming a transparent electrode is removed by means of etching or the like.

According to the present invention, the holding substrate for forming the transparent electrode is removed, with the result that the emission rate generated at the electroluminescent layer is improved, and the brightness and contrast of the display element are improved.

BRIEF DESCRIPTION OF THE DRAWINGS

In the accompanying drawings:

FIG. 5 is an explanatory diagram showing a construction of a third embodiment of a display element in accordance with the present invention; and FIG. 6 is an explanatory diagram showing a construction of a fourth embodiment of a display element in accordance with the present invention.

DETAILED DESCRIPTION OF THE PREFERRED EMBODIMENTS

Hereinafter, detailed explanation is made of the embodiments of the present invention.

Embodiment 1

Figure 1:
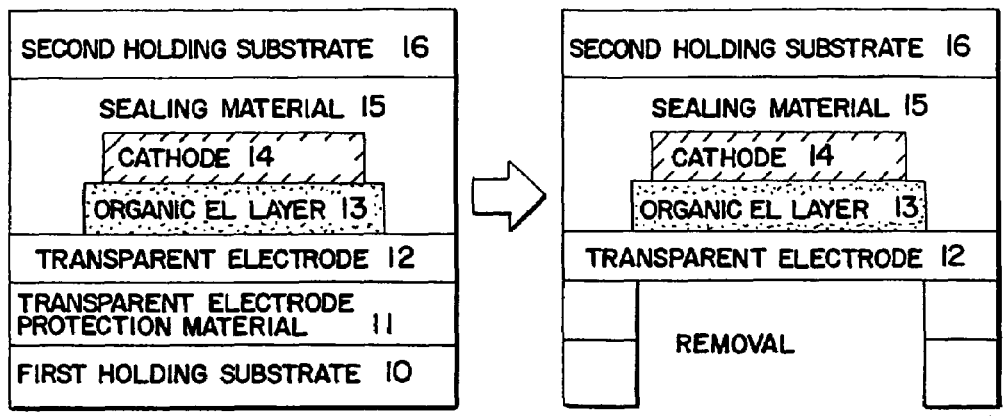
FIG. 1 is an explanatory diagram showing a structure of a first embodiment of a display element in accordance with the present invention.

FIG. 1 is an explanatory diagram showing a construction of and a method of manufacturing a first embodiment of a display element in accordance with the present invention. The sequence for depositing an organic electroluminescent display element in the first embodiment of the present invention is, first, to deposit a transparent electrode protection material 11 onto of a first holding substrate 10 made of glass, for example. After sputtering a transparent electrode 12 on the transparent electrode protection material 11, an organic electroluminescent layer 13 is formed by vapor depositing or by spin coating, and cathode 14 is vapor deposited. After that, a sealing material 15 is used to adhere a second holding substrate 16. Then, the first holding substrate 10 and the transparent electrode protection material are etched and removed in sequence.

(The First Holding Substrate)

The first holding substrate 10 may be formed of a metal, an inorganic substrate or a polymer other than glass, as far as the first holding substrate 10 thus formed has excellent surface smoothness (i.e. the surface smoothness roughly equivalent to that of standard glass substrates having transparent electrodes). However, the substrate is needed to be removed partially or entirely after sealing by using the second holding substrate 16, for example. The first holding substrate 10 is removed last; therefore, provided that the substrate is strong enough to hold the light emitting elements (12-14) until the time of sealing, then the thinner the substrate is the better. The etching of the first holding substrate 10 can be conducted and the substrate may be entirely removed without patterning, or it is possible, for example, to remove only a portion of the light-emitting portion. Examples of usable materials for the first holding substrate 10 are shown in Chart 1.

CHART 1

| | Material | Etchant |
|---|---|---|
| Glass, inorganic substances | Silica glass | Hydrofluoric acid, Fluoric nitric acid |
| | Titanium oxide | Thermal condensed sulfuric acid; Sodium hydroxide |
| | Silicon | Hydrofluoric acid, Fluoric nitric acid |
| Metal | Aluminum | Hydrochloric acid, Rare sulfuric aid, Nitric acid |
| | Titanium | Hydrofluoric acid |
| Polymer | PMMA | Toluene, Chloroform |
| | Polycarbonate | Chloroform, Acetone, DMF |

(The Transparent Electrode Protection Material)

For the transparent electrode protection material 11 formed to the first holding substrate 10 by, for example, spin coating, it is preferable to use a material that resists the etchant (etching material) of the first holding substrate 10, and can resist the heat and light (i.e., plasma light from the sputter, etc.) when the transparent electrode 12 is deposited and formed.

The role of the transparent electrode protection material 11 is to act as an etching stopper when the first holding substrate 10 is etched. Therefore, it is not necessary for the transparent electrode protection material 11 to be present when the first holding substrate 10 is to be etched in the case either when an etchant can be used which will not melt the transparent electrode 12, or when complete time control for the etching is possible.

The transparent electrode protection material 11 is preferably a material which can be removed after etching the first holding substrate 10. The transparent electrode protection material 11 can also be non-transparent if it can be removed completely. Further, it is not necessary for the transparent electrode protection material 11 to be transparent in the case when the transparent electrode protection material 11 is to be removed in the thickness direction. However, it is preferable that light not be absorbed in the visible light area. Chart 2 shows materials that can be used for the transparent electrode protection material 11.

CHART 2

| Material | Etchant |
|---|---|
| Norbornen polymer | Toluene, Chloroform |
| Polystyrene | Toluene, THF |
| Polycarbonate | Chloroform, Acetone, DMF |
| Copper phthalocyanine | Chloroform, Acetone |
| Resist material | Acetone |
| Acryl | ($O_2$ Plasma dry etching) |

(The Transparent Electrode)

The transparent electrode 12 is made of ITO, for example, and has a film thickness of 80 nm-150 nm, for example. Further, in order to minimize guided waves in the film, it is preferable that the transparent electrode 12 itself be thin. Note that for the transparent electrode 12, the organic electroluminescent layer 13, and the cathode 14 of metal or the like, it is possible to adopt and use exactly the same materials and depositing methods as for the organic electroluminescent light-emitting element in the conventional and known art.

(The Sealing Material)

For the sealing material, it is preferable to use a material which can resist the etchant for the first substrate and the transparent electrode protection material. In the case that a non-resisting material is used, the first holding substrate and the transparent electrode protection material are etched after protecting bare parts of the sealing material for the side face of the substrate. Materials such as epoxy resin, optical curing epoxy resin, optical curing acrylic resin can be used for the sealing material.

(The Second Holding Substrate)

It is desirable that the etchant used for the second holding substrate 16 be different from that used for the first holding substrate 10. In the case that the second holding substrate 16 has resistance against the etchant for the first holding substrate 10, consideration does not have to be made for the protecting of the second holding substrate 16 when etching the first holding substrate 10, so the process is simple and easy. The second substrate 16 is no necessary in the case that strength can be maintained merely by means of the sealing material 15 after the etching of the first holding substrate 10 and the transparent electrode protection material 11.

Materials such as, for example, sheet glass, sheet metals such as aluminum, polyethylene, polycarbonate, polyimide or other polymer sheets can be used for the material of the second holding substrate 16. Note, however, that plastics may be used for the sealing material and the second holding substrate so that a flexible display element can be manufactured.

Figure 2A:
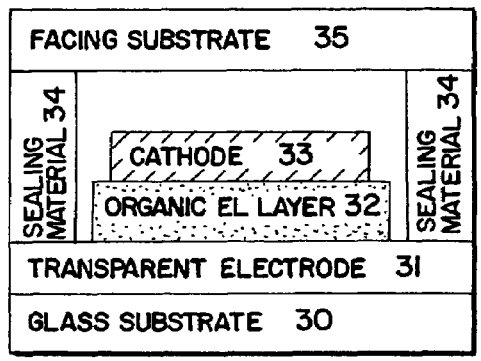
FIGS. 2A to 2C are explanatory diagrams showing constructions and operations of a conventional display element.
Figure 2B:
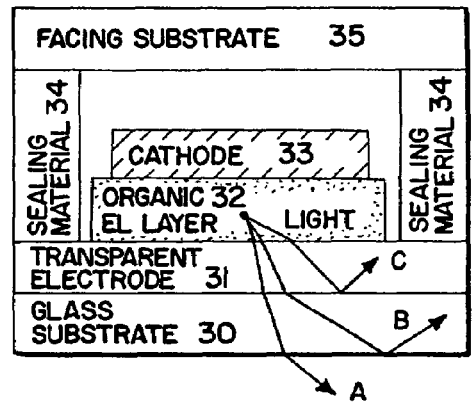
Figure 2C:
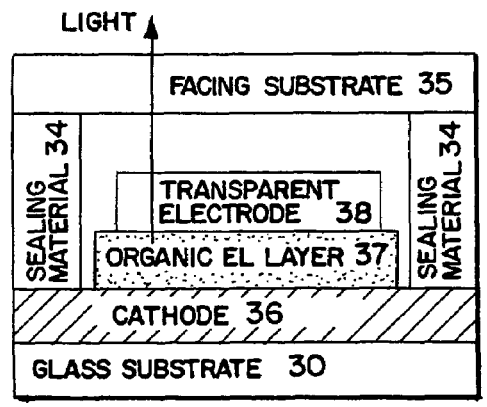

The construction of a display element, according to the first embodiment as shown in FIG. 1, is such that the transparent electrode 12 is exposed. Therefore, almost all of the light that was guided into the glass substrate 30 in conventional display elements (FIG. 2B, optical path B) is emitted externally through the transparent electrode. Thus, the emission rate is improved as compared with the conventional display element.

Embodiment 2

Figure 3:
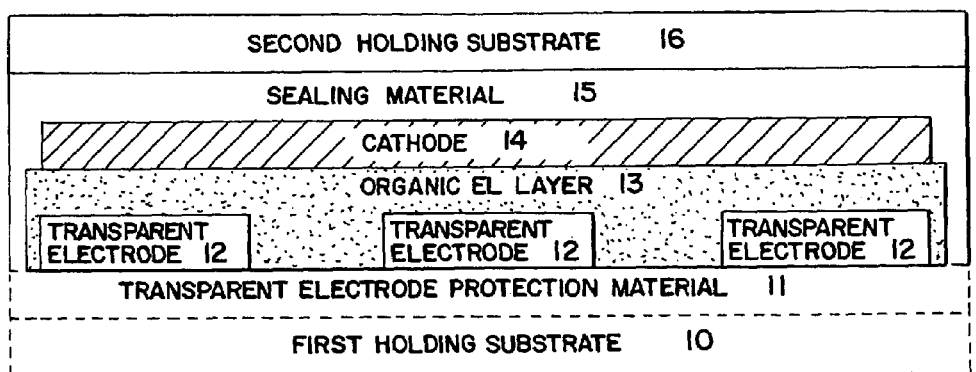
FIG. 3 is an explanatory diagram showing problems arising in the case of a simple matrix construction.

Next, explanation is made of a second embodiment. FIG. 3 is an explanatory diagram showing problems arising in the case of a simple matrix construction. When a plurality of pixels address independently, as they do in a simple matrix construction, patterning of the transparent electrode 12 becomes necessary. In this case, there is the problem that the organic electroluminescent layer 13 comes into direct contact with the etchant during the etching of the transparent electrode protection material 11 and, moreover, the light emission side of the organic electroluminescent layer 13 is partially exposed to the atmosphere.

Figure 4:
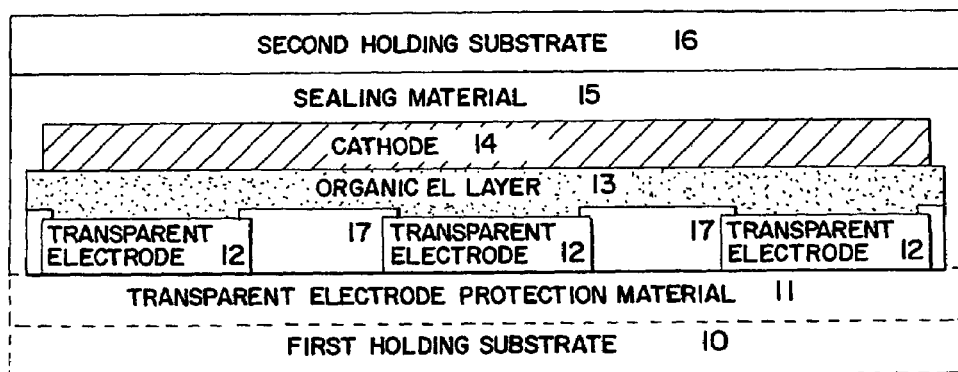
FIG. 4 is an explanatory diagram showing a construction of a second embodiment of a display element in accordance with the present invention.

FIG. 4 is an explanatory diagram showing a construction according to the second embodiment of the display element of the present invention in the case when the present invention is constructed in a simple matrix construction. In the case that it is desired that the organic electroluminescent layer 13 be protected from the etchant for the transparent electrode protection material 11, that exposure of the organic electroluminescent layer 13 to the atmosphere be prevented, an organic electroluminescent protection material 17 is deposited on the portions where the transparent electrode 12 was not formed after patterning the transparent electrode 12. In order to prevent tearing of the cathode 14, the thickness of the organic electroluminescent protection material 17 is preferably less than the combined thickness of the transparent electrode 12 and the organic electroluminescent layer 13, for example, 150 nm. Such materials as, for example, silica glass, acrylic resin, polyimide resin, etc. can be used as the material of the protection material 17.

Embodiment 3

Next, explanation is made of a third embodiment. FIG. 5 is an explanatory diagram showing a construction of a third embodiment of the display element of the present invention when the display element of the present invention is constructed in a simple matrix construction. In the case that the organic electroluminescent protection material 17 is not used, parts of the first holding substrate 10 and the transparent electrode protection material 11 are etched and the first holding substrate 10 and the transparent electrode protection material 11 are removed only where the transparent electrode 12 exists, so as not to expose the organic electroluminescent layer 13.

FIG. 5 is an example in which the first holding substrate 10 and the transparent electrode protection material 11 on the transparent electrode 12 are removed in the shape of a line, and holes 20 are formed. The upper diagram is a cross-sectional view along the line B-B, and the lower diagram is a diagram viewing the display element from the side of the first holding substrate 10. The lower diagram is an abbreviated depiction. The simple matrix is constructed by positioning tens or hundreds of cathodes 14 and transparent electrodes 12 in a grid. The holes 20 do not have to be provided in a line shape, but can also be provided in a rectangle (or square) shape only where the cathode 14 and the transparent electrodes 12 overlap.

When the display element is constructed as shown in FIG. 5, the first substrate 10 and the transparent electrode protection material 11 surround the light-emitting area. Therefore, the contrast of the display element can be improved by either the first substrate 10 or the transparent electrode protection material 11 being black, for example.

Embodiment 4

FIG. 6 is an explanatory diagram showing a construction of a fourth embodiment of the display element of the present invention. Embodiment 4 is a method of controlling the light-emitting location without patterning the transparent electrode. Embodiment 4 is a method of sandwiching $SiO_2$, a resist, or other such insulating film 21 at the portions where it is not desired that light be emitted from the electrode 12 that has been formed to the entire surface. In this case, in order that the insulating membranes 21 do not tear the organic electroluminescent layer 13 at the time when the organic electroluminescent layer 13 is deposited and formed, it is desirable to form the insulating membranes 21 at a thickness of 100 nm or less. When the display element is constructed according to this method, electronic current potential screening is performed across the entire surface of the transparent electrode 12. The light-emitting region, therefore, is not controlled in parts. Instead, patterning methods for fixed, still images or for plane emission are used.

Next, explanation is made of specific examples of combinations of materials used for each layer and of manufacturing processes. Materials Example 1 is an example in which glass is used for the first holding substrate 10, polystyrene is used for the transparent electrode protection material 11, and aluminum is used for the second holding substrate 16, for the display element of Embodiment 1.

Materials Example 1

1. The transparent electrode protection material (polystyrene) is spin coated onto the first holding substrate (glass).
2. The transparent electrode (ITO) is sputtered onto the substrate-described in 1.
3. The organic electroluminescent layer is produced on the substrate described in 2.
4. After sealing the organic electroluminescent layer on the substrate described in 3, the substrate is held by means of the second holding substrate (aluminum).
5. The first holding substrate of the substrate described in 4 is melted by means of hydrofluoric acid.
6. The polystyrene of the substrate described in 5 is melted by means of toluene.

Materials Example 2 is an example in which aluminum is used for the first holding substrate 10, polycarbonate is used for the transparent electrode protection material 11, and glass is used for the second holding substrate 16, for the display element of Embodiment 2.

Materials Example 2

1. The transparent electrode protection material (polycarbonate) is spin coated onto the first holding substrate (aluminum).
2. The transparent electrodes (ITO) are sputtered onto the substrate described in 1.
3. The transparent electrodes on the substrate described in 2 are patterned.
4. The organic electroluminescent protection material ($SiO_2$) is sputtered onto the substrate described in 3, and the exposed portions of the transparent electrode protection material are coated. After forming the film layer, the $SiO_2$ coating covering the transparent electrodes is reverse-sputtered, and surfaces of the transparent electrodes are exposed.
5. The organic electroluminescent layer is produced on the substrate described in 4.
6. After sealing the organic electroluminescent layer on the substrate described in 5, the substrate is held by means of the second holding substrate (glass).
7. The first holding substrate (aluminum) described in 6 is melted by means of hydrochloric acid.
8. The polycarbonate of the substrate described in 7 is melted by means of toluene.

Materials Example 3 is an example in which, glass is used for the first holding substrate 10, acryl is used for the transparent electrode protection material 11, and titanium oxide is used for the second holding substrate 16, for the display element of Embodiment 3.

Materials Example 3

1. The transparent electrode protection material (acryl) is spin coated onto the first holding substrate (glass).
2. The transparent electrodes (ITO) are sputtered onto the first substrate described in 1.
3. The transparent electrodes on the substrate described in 2 are patterned.
4. The organic electroluminescent layer is produced on the substrate described in 3.

5. After sealing the organic electroluminescent layer on the substrate described in 4, the substrate is held by means of the second holding substrate (titanium oxide).

6. The first holding substrate (glass) of the substrate described in 5 is patterned with the resists, and after etching only the portions where the transparent electrodes are arranged, the resists are then removed.

7. The acryl of the substrate described in 6 is removed by means of $O_2$ plasma only where the first holding substrate was removed.

In the present invention, the construction described above enables the first holding substrate to be removed and, if the transparent electrode or electrodes are thin enough, light is not wave-guided. An effect is thereby produced such that the emission rate from the electroluminescent layer is improved. Further, by raising the emission ratio, there is also an effect such that the same brightness as is obtained from standard elements can be obtained with lower voltage, and greater longevity and energy-saving are also made possible.

Further, the method of the present invention also produces the effect that it is not necessary to be concerned with the damage that was mentioned in connection with the prior art and that is suffered when the transparent electrode film is sputtered or otherwise deposited on the organic electroluminescent layer according to the method that begins by forming the cathode.

Additionally, there was the problem that in the case when the plastic substrate was used to manufacture the display element, the temperature during the deposition of the transparent electrode or electrodes had to be kept low. However, with the present invention, it is possible to realize a polymer second holding substrate without concern for the temperature.

What is claimed is:

1. A display device comprising:
   a transparent electrode protection layer;
   first and second transparent electrodes over the transparent electrode protection layer;
   an electroluminescent layer over the first and second transparent electrodes;
   a layer for protecting the electroluminescent layer between the first and second transparent electrodes and under the electroluminescent layer;
   an electrode over the electroluminescent layer;
   a sealing material over the electrode; and
   a substrate over the sealing material,
   wherein the sealing material is in contact with the transparent electrode protection layer and the electroluminescent layer, and
   wherein the electroluminescent layer is in contact with the first and second transparent electrodes.

2. A display device according to claim 1, wherein the electrode is a cathode.

3. A display device according to claim 1, wherein the display device is in a simple matrix construction.

4. A display device according to claim 1, wherein the electroluminescent layer comprises an organic material.

5. A display device comprising:
   a transparent electrode protecting layer;
   first and second transparent electrodes over the transparent electrode protecting layer;
   an electroluminescent layer over the transparent electrode protecting layer and the first and second transparent electrodes;
   an electrode over the electroluminescent layer;
   a sealing layer over the electrode; and
   a first substrate over the sealing layer,
   wherein the first and second transparent electrodes partially overlap the transparent electrode protecting layer, and
   wherein the transparent electrode protecting layer has a first hole under the first transparent electrode and a second hole under the second transparent electrode.

6. A display device according to claim 5, wherein the electrode is a cathode.

7. A display device according to claim 5, further comprising a second substrate under the first and second transparent electrode,
   wherein the second substrate surrounds a light-emitting area.

8. A display device according to claim 5, wherein the display device is in a simple matrix construction.

9. A display device according to claim 5, wherein the electroluminescent layer comprises an organic material.

10. A display device comprising:
    a transparent electrode;
    first and second insulating films over the transparent electrode;
    an electroluminescent layer over the transparent electrode and the first and second insulating films;
    an electrode over the electroluminescent layer;
    a sealing layer over the electrode; and
    a substrate over the sealing layer,
    wherein the sealing material is in contact with the transparent electrode and the electroluminescent layer,
    wherein a part of the electroluminescent layer is located between the first and second insulating films, and
    wherein at least a part of the transparent electrode is exposed.

11. A display device according to claim 10, wherein the electrode is a cathode.

12. A display device according to claim 10, wherein the display device is in a simple matrix construction.

13. A display device according to claim 10, wherein the electroluminescent layer comprises an organic material.

14. A display device comprising:
    a transparent electrode protection layer having a hole;
    a transparent electrode over the transparent electrode protection layer;
    an electroluminescent layer over the transparent electrode;
    an electrode over the electroluminescent layer;
    a sealing layer over the electrode; and
    a first substrate over the sealing layer,
    wherein the sealing material is in contact with the transparent electrode and the electroluminescent layer.

15. A display device according to claim 14, wherein the electrode is a cathode.

16. A display device according to claim 14, further comprising a second substrate, wherein the second substrate has a hole surrounding a light-emitting area.

17. A display device according to claim 14, wherein the display device is in a simple matrix construction.

18. A display device according to claim 14, wherein the electroluminescent layer comprises an organic material.

* * * * *